United States Patent
Abramovici et al.

(10) Patent No.: US 6,631,487 B1
(45) Date of Patent: Oct. 7, 2003

(54) ON-LINE TESTING OF FIELD PROGRAMMABLE GATE ARRAY RESOURCES

(75) Inventors: Miron Abramovici, Berkeley Heights, NJ (US); Charles E. Stroud, Charlotte, NC (US)

(73) Assignees: Lattice Semiconductor Corp., Hillsboro, OR (US); University of Ketucky Research Foundation, Lexington, KY (US)

( * ) Notice: Subject to any disclaimer, the term of this patent is extended or adjusted under 35 U.S.C. 154(b) by 419 days.

(21) Appl. No.: 09/671,853

(22) Filed: Sep. 27, 2000

Related U.S. Application Data

(60) Provisional application No. 60/156,189, filed on Sep. 27, 1999.

(51) Int. Cl.[7] .......................... G01R 31/28; H01L 25/00; G11C 7/00; G06F 17/50
(52) U.S. Cl. .......................... 714/725; 326/23; 326/41; 365/189.04; 716/16
(58) Field of Search ................................. 714/724, 725; 703/24; 326/23, 41; 365/189.04; 716/16

(56) References Cited

U.S. PATENT DOCUMENTS

| | | |
|---|---|---|
| 4,757,503 A | 7/1988 | Hayes et al. |
| 5,051,996 A | 9/1991 | Bergeson et al. |
| 5,107,208 A | 4/1992 | Lee |
| RE34,445 E | 11/1993 | Hayes et al. |
| 5,260,946 A | 11/1993 | Nunally |
| 5,278,841 A | 1/1994 | Myers |
| 5,329,470 A * | 7/1994 | Sample et al. ................. 703/28 |
| 5,347,519 A | 9/1994 | Cooke et al. |
| 5,425,036 A | 6/1995 | Liu et al. |
| 5,430,734 A | 7/1995 | Gilson |
| 5,488,612 A | 1/1996 | Heybruck |
| 5,508,636 A | 4/1996 | Mange et al. |
| 5,623,501 A | 4/1997 | Cooke et al. |

(List continued on next page.)

OTHER PUBLICATIONS

G. Gibson et al., "Boundary–Scan Access of Built in Self Test for Field Programmable Gate Arrays," Proc. IEEE Internationa ASIC Conf. pp. 57–61, Sep. 7–10, 1997.

(List continued on next page.)

*Primary Examiner*—Albert Decady
*Assistant Examiner*—Anthony T. Whittington

(57) ABSTRACT

A method of testing field programmable gate array (FPGA) resources and identifying faulty FPGA resources during normal on-line operation includes configuring an FPGA into a working area and an initial self-testing area. The working area maintains normal operation of the FPGA throughout testing and identifying of the resources. Within the initial and subsequent self-testing areas, the FPGA resources are initially tested for faults. Upon detection of a fault in the FPGA resources, the initial self-testing area resources are reconfigured or subdivided and further tested in order to identify the faulty resource. Dependent upon the further test results, the FPGA resources may be further subdivided and tested until the faulty resource is identified. Once the faulty resource is identified, the FPGA is reconfigured to replace unusable faulty resources or to avoid faulty modes of operation of partially faulty resources diagnosed during further testing. In this manner, partially faulty resources are allowed to continue operation in a diminished capacity to enhance fault tolerance. After testing each of the FPGA resources located within the initial self-testing area for faults, identifying the faulty resources, and in some instances diagnosing faulty modes of operation of the faulty resource, the FPGA is reconfigured such that a portion of the working area becomes a subsequent self-testing area and the initial self-testing area replaces that portion of the working area. In other words, the self-testing area roves around the FPGA testing its resources in a continuous manner.

26 Claims, 4 Drawing Sheets

U.S. PATENT DOCUMENTS

| | | | | | |
|---|---|---|---|---|---|
| 5,633,813 | A | * | 5/1997 | Srinivasan | 703/14 |
| 5,790,771 | A | * | 8/1998 | Culbertson et al. | 714/3 |
| 5,887,002 | A | * | 3/1999 | Cooke et al. | 714/725 |
| 6,049,487 | A | * | 4/2000 | Plants et al. | 365/189.04 |
| 6,107,821 | A | * | 8/2000 | Kelem et al. | 326/38 |
| 6,108,806 | A | * | 8/2000 | Abramovici et al. | 714/725 |
| 6,130,554 | A | * | 10/2000 | Kolze et al. | 326/41 |
| 6,167,558 | A | * | 12/2000 | Trimberger | 716/16 |
| 6,202,182 | B1 | * | 3/2001 | Abramovici et al. | 714/725 |
| 6,377,911 | B1 | * | 4/2002 | Sample et al. | 703/24 |
| 6,574,761 | B1 | * | 6/2003 | Abramovici et al. | 714/25 |

OTHER PUBLICATIONS

A. Hassan et al., "Testing and Diagnosis of Interconnects Using Boundary Scan Architecture," Proc. IEEE International Test Conf. PP 126–137, Sep. 12–14, 1988.

W.K. Huang et al., "An Approach to Testing Programmable/Configurable Field Programmable Gate Arrays," Proc. IEEE VLSI Test Symp pp. 450–455, Apr. 28–May 5, 1996.

T. Liu et al., "Diagnosis of Interconnects and FPICS Using a Structured Walking–1 Approach," Proc. IEEE VLSI Test Symp, pp. 256–261, Apr. 30–May 3, 1995.

F. Lombardi et al., "Diagnosing Programmable Interconnect Systems for FPGAS," Proc ACM/SIGDA International Symp on FPGA, PP 100–106, 1996.

C. Stroud et al., "Evaluation of FPGA Resources for Built in Self Test of Programmable Logic Blocks," Proc ACM/SIGDA Inter. Symp. on FPGAS PP 107–113, 1996.

C. Stroud et al., "Built in Self Test for Programmable Logis Blocks in FPGA," Proc IEEE VLSI Test Symp, PP 387–392, Apr. 28–May 1, 1996.

C. Stroud et al., "Using ILA Testing for Bist in FPGAS," Proc IEEE International Test Conf., PP 68–75, Oct. 20–25, 1996.

C. Stroud et al., "BIST Based Diagnostics for FPGA Logic Blocks," Proc. IEEE International Test Conf., PP 539–547, Nov. 1–6, 1997.

N. Shnidman et al., "On–Line Fault Detection for BusBased Field Programmable Gate Arrays," IEEE Transactions on VLSI Systems, vol. 6, No. 4, Dec., 1998.

L. Shombert et al., "Using Redundancy for Concurrent Testing and Repairing of Systolic Arrays," Proc. 17th Fault-Tolerant Computing Symp., 1987.

* cited by examiner

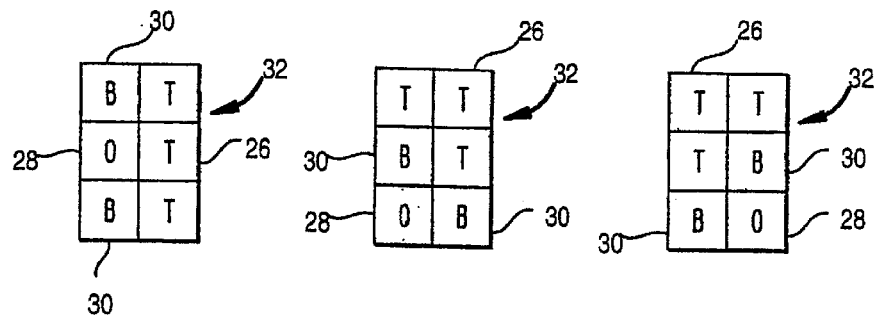
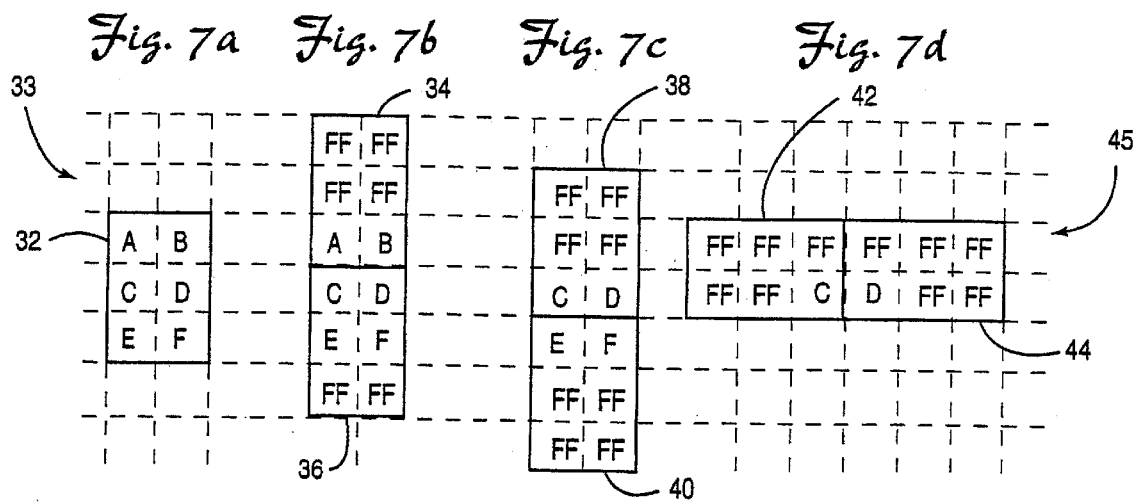

ON-LINE TESTING OF FIELD PROGRAMMABLE GATE ARRAY RESOURCES

This application claims the benefit of U.S. Provisional Application No. 60/156,189, filed Sep. 27, 1999.

TECHNICAL FIELD

The present invention relates generally to the field of testing of integrated circuit devices and, more particularly, to a method of testing field programmable gate array resources and identifying faulty field programmable gate array resources.

BACKGROUND OF THE INVENTION

A field programmable gate array (FPGA) is a type of integrated circuit consisting of an array of programmable logic blocks interconnected by a programmable routing network and programmable input/output cells. Programming of the logic blocks, the routing network and the input/output cells is selectively completed to make the necessary interconnections that establish one configuration thereof to provide the desired system operation/function for a particular application.

The present inventors have recently developed methods of built-in self-testing the array of programmable logic blocks and the programmable routing resources in FPGAs at the device, board and system levels. These methods are set out in detail in U.S. Pat. Nos. 5,991,907, 6,003,150, and 6,108,806 and pending U.S. application Ser. No. 09/109,123. The full disclosures in these patents and patent applications are incorporated herein by reference.

In addition to these off-line testing methods, the present inventors have also recently developed methods of on-line testing and fault tolerant operation of FPGAs. These methods are set out in detail in pending U.S. application Ser. Nos. 09/261,776, 09/405,958, 09/406,219, and 09/611,449. The full disclosure of these patent applications is also incorporated herein by reference.

On-line testing and fault tolerant operation of FPGAs is most important in high-reliability and high-availability applications, such as, space missions, telecommunication network routers, or remote equipment in which adaptive computing systems often rely on reconfigurable hardware to adapt system operation. In such applications, the FPGA hardware must work continuously and simply cannot be taken off-line for testing, maintenance, or repair.

When a fault is detected in the resources of the FPGA hardware of these systems during testing, the faulty resource must be quickly identified and the remaining FPGA resources reconfigured to replace the faulty resource, or a faulty mode of operation of the identified resource diagnosed in order to allow continued operation of the faulty resource in a diminished capacity. Therefore, the steps of testing and identifying FPGA resources, and diagnosing faulty modes of operation in the faulty identified resources must be performed concurrently with normal system operation.

SUMMARY OF THE INVENTION

In accordance with the present invention, resources of a field programmable gate array (FPGA) determined to be faulty during testing may now be quickly identified and the remaining FPGA resources reconfigured to replace the faulty resource, or a faulty mode of operation of the identified resource diagnosed in order to allow its continued operation in a diminished capacity, during normal on-line operation of the FPGA. Specifically, when a fault is detected in a group of FPGA resources under test, the FPGA resources are reconfigured such that the resources within the group of resources under test are subdivided and grouped with additional FPGA resources known to be fault free for further testing. Dependent upon the result of the further testing, the steps of reconfiguring and further testing are repeated until the detected faulty resource is identified. Once the faulty resource is identified, the remaining FPGA resources are reconfigured to replace the faulty resource in order to provide fault tolerant operation of the FPGA.

On-line testing of the FPGA resources is accomplished by configuring the FPGA into a working area and an initial self-testing area. The working area maintains normal operation of the FPGA throughout testing. Within the initial and subsequent self-testing areas, however, the FPGA resources are tested for faults. It is initially presumed that all of the resources of the FPGA are fault-free as determined through manufacturing testing.

Within the initial self-testing area, test patterns are generated and applied to FPGA resources selected for testing. Outputs of a first group of FPGA resources under test, e.g., programmable logic blocks, programmable routing network resources, or a combination of both, are preferably compared to outputs of a second group of equivalently configured FPGA resources under test. Based on a comparison of the outputs of the groups of FPGA resources under test, fault status data is generated.

When the fault status data indicates the detection of a fault in the groups of FPGA resources under test, the resources within the initial self-testing area of the FPGA are reconfigured into subsequent groups of FPGA resources under test for further testing in order to identify the faulty resource. As indicated above, the group of FPGA resources under test where the fault was detected is subdivided and its resources grouped with additional FPGA resources known to be fault free to form subsequent groups of FPGA resources for further testing in the manner described above.

In accordance with another aspect of the present inventive method, the initial self-testing area of the FPGA is preferably configured to include groups of FPGA resources, or self-testing tiles, for testing the programmable logic blocks. Each self-testing tile preferably includes programmable logic blocks configured to function as a test pattern generator, an output response analyzer, and equivalently configured programmable logic blocks under test. The initial self-testing area of the FPGA may be divided into any number of equivalently configured self-testing tiles so long as each testing tile contains a sufficient amount of FPGA resources to complete testing. Advantageously, this allows for concurrent testing of the programmable logic blocks in several testing tiles within the self-testing area, thus reducing the overall test time and fault latency.

During testing, test patterns are generated by the test pattern generator and applied to the programmable logic blocks under test. Outputs of a first programmable logic block under test are compared to outputs of a second equivalently configured programmable logic block under test by the output response analyzer. Based on the comparison of the outputs of the programmable logic blocks under test, fault status data is generated.

When the fault status data indicates the detection of a fault in one of the logic blocks of a testing tile, the resources within the initial self-testing area of the FPGA are reconfigured into subsequent self-testing tiles in order to identify the faulty programmable logic block. Specifically, the logic blocks in the testing tile where the fault is originally detected are subdivided and grouped with additional logic blocks known to be fault-free to form the subsequent testing tiles wherein the logic blocks are further tested in the manner described above. Dependent upon the subsequent fault status data, the programmable logic blocks in the subsequent self-testing tiles may be further subdivided, grouped, and tested until the detected faulty logic block is identified. Once the faulty logic block is identified, the remaining FPGA resources are reconfigured to replace the faulty logic block in order to provide fault tolerant operation. Alternatively, diagnostic testing of the identified logic block is conducted in order to determine a faulty mode of operation.

Based on the fault status data generated during diagnostic testing, partially faulty logic blocks may be reconfigured to perform only non-faulty functions or modes of operation and further utilized. By reconfiguring partially faulty logic blocks to avoid all modes of operation affected by the fault, the partially faulty logic blocks are allowed to continue to operate in a progressively diminished, although acceptable, capacity for specific operating modes.

To test the programmable routing resources of the FPGA, test patterns are generated and propagated along groups of wires under test. Output patterns of a first group of wires under test are preferably compared to output patterns of a second group of wires under test receiving the same patterns. In order to achieve a complete test of the programmable routing resources within the initial self-testing area, the groups of wires under test include wire segments of varying lengths interconnected by configuration interconnect points, and possibly programmable logic blocks configured as identify functions. Advantageously, this allows both global routing resources between programmable logic blocks and local routing resources leading to each programmable logic block to be tested. As indicated above, the output patterns of the groups of wires under test are compared and test result data generated.

In order to minimize the number of reconfigurations of the FPGA under test and reduce overall testing time and fault latency, parallel testing of the programmable routing resources are preferably utilized. Specifically, comparisons of the output patterns of segments of the groups of wires under test may be made at several locations along the groups of wires under test utilizing a plurality of FPGA resources configured as output response analyzers producing fault status data for each segment of the groups of wires under test.

When the fault status data indicates the detection of a fault in one of the groups of wires under test, the resources within the groups of wires under test are reconfigured into subsequent groups of wires under test in order to identify the faulty routing resource. Specifically, the resources in the groups of wires under test where the fault is originally detected are subdivided and grouped with additional resources known to be fault-free to form the subsequent groups of wires under test wherein the routing resources are further tested in the manner described above. Dependent upon the subsequent fault status data, the routing resources in the subsequent groups of wires under test may be further subdivided, grouped, and tested until the detected faulty routing resource is identified. Once the faulty routing resource is identified, the remaining FPGA resources are reconfigured to replace the faulty resource in order to provide fault tolerant operation.

Upon completion of testing each of the FPGA resources located within the initial self-testing area, identifying the faulty resources, and diagnosing the faulty logic blocks, the FPGA under test is reconfigured so that a portion of the working area becomes a subsequent self-testing area, and the initial self-testing area, reconfigured to avoid faulty resources, becomes a portion of the working area. In other words, the self-testing area roves around the FPGA under test repeating the steps of testing and reconfiguring within the self-testing areas until each portion of the FPGA under test, is reconfigured as a subsequent self-testing area, tested, and detected faults within the FPGA resources diagnosed. As noted above, the present method of testing allows for normal operation of the FPGA under test to continue within the working area uninterrupted by the testing conducted within the self-testing areas.

An apparatus for testing the resources of the FPGA under test during normal on-line operation includes a test and reconfiguration controller in communication with the FPGA under test for: (a) configuring the FPGA under test into an initial self-testing area and a working area, the working area maintaining normal operation of the FPGA; (b) testing the resources located within the initial self-testing area for faults; (c) reconfiguring the resources located within the initial self-testing area for further testing in order to identify the faulty resource; (d) further testing resources located within the reconfigured self-testing area; and (e) repeating the steps of reconfiguring and further testing until the faulty resource is identified. The testing apparatus further includes a storage medium in communication with the test and reconfiguration controller for storing a plurality of test configurations, and usage and fault status data for each FPGA resource.

An FPGA in accordance with the present invention includes a plurality of programmable logic blocks and a plurality of programmable routing resources interconnecting the programmable logic blocks initially configured as an initial self-testing area for testing at least a portion of the programmable routing resources and/or programmable logic blocks for faults, and an initial working area for maintaining normal operation of the FPGA during testing. The portion of the programmable routing resources and/or programmable logic blocks located within the initial self-testing area are further subdivided and tested until the faulty programmable routing resource or programmable logic block is identified.

BRIEF DESCRIPTION OF THE DRAWINGS

The accompanying drawings incorporated in and forming a part of the specification, illustrate several aspects of the present invention and together with the description serve to explain the principles of the invention. In the drawings:

FIG. 6A–6F are illustrations of a self-testing tile showing each stage of the preferred systematic rotation of the functions of the programmable logic blocks;

FIG. 7A is an illustration of an initial vertical self-testing tile within the initial self-testing area of the FPGA under test in accordance with a preferred embodiment;

FIG. 7B is an illustration of the initial self-testing area reconfigured to include two subsequent vertical self-testing tiles each including a subdivided portion of the programmable logic blocks of the initial vertical self-testing tile in order to identify the faulty logic block;

FIG. 7C is an illustration of the initial self-testing area further reconfigured to include two additional subsequent vertical self-testing tiles each including a subdivided portion of the programmable logic blocks of one of the subsequent vertical self-testing tiles; and FIG. 7D is an illustration of the initial self-testing area reconfigured to include two horizontal self-testing tiles within a horizontal self-testing area each including a subdivided portion of the programmable logic blocks of one of the additional subsequent vertical self-testing tiles;

Reference will now be made in detail to the present preferred embodiment of the invention, an example of which is illustrated in the accompanying drawings.

DETAILED DESCRIPTION OF THE INVENTION

A typical field programmable gate array (FPGA) generally consists of a plurality of resources including an array of programmable logic blocks (PLBs) interconnected by programmable routing resources and programmable input/output cells or boundary scan ports (most FPGAs feature a boundary-scan mechanism). Such structures are, for example, featured in the Lucent ORCA programmable function units, in the Xilinx XC4000 configurable logic block, and in the ALTERA FLEX 8000 logic element. In accordance with the present inventive method, the resources of an FPGA under test 10 are tested for faults, the faulty resources identified, and the FPGA 10 reconfigured to avoid the identified faulty resources during normal on-line operation.

Figure 1:
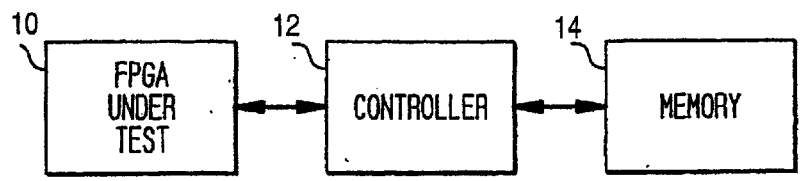
FIG. 1 is a schematic block diagram of an apparatus for testing resources of a field programmable gate array (FPGA)

As shown in schematic block diagram in FIG. 1, configuring, testing, identifying, and reconfiguring of the FPGA resources are preferably controlled by a test and reconfiguration controller 12. In the present preferred embodiment, an external test and reconfiguration controller 12 is utilized because present commercially available FPGAs do not allow internal access to their configuration memory. Accordingly, a configuration decompiler tool of a type known in the art is utilized to determine the intended function or mode of operation of the FPGA resources. Alternatively, this information may be extracted from the design stage and made available to the controller 12. It should be appreciated by those skilled in the art that any controller, e.g., internal or external to an FPGA, could be utilized with an FPGA that allows for internal access to its configuration memory and that a single test and reconfiguration controller is capable of controlling several FPGAs. For purposes of illustration of the present preferred embodiment of the invention, however, a one-to-one controller to FPGA ratio is utilized.

The preferred controller 12 may be implemented on an embedded microprocessor in communication with a storage medium or memory 14 for storing the various FPGA operational configurations, as well as, test data, and fault-tolerant functions including their associated fault-tolerant reconfigurations. The controller 12 and memory 14 further exchange and store usage status data (e.g., functional status, unused spare status or spare status) used in testing and fault status data (e.g., fault-free status, defective status or partially usable status) for the FPGA resources. These data are subsequently utilized in reconfiguring the FPGA under test 10 to replace unusable faulty resources or to avoid faulty modes of operation of partially faulty PLBs. The utilization of usage and fault status data is further described in more detail below.

Figure 2:
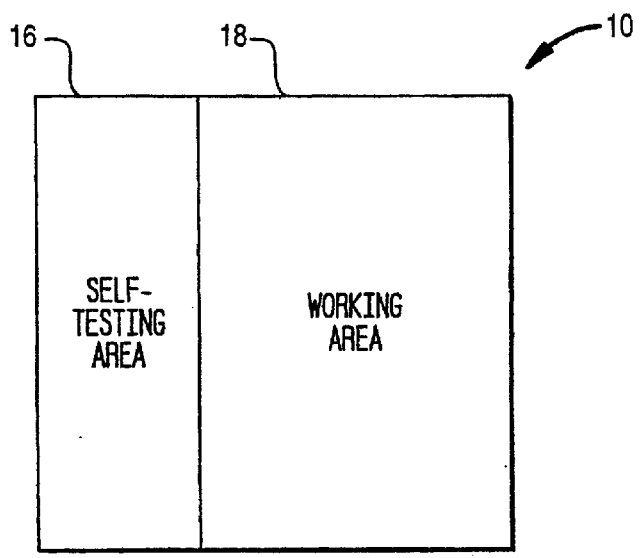
FIG. 2 is an illustration of an FPGA under test configured into an initial self-testing area and a working area wherein the working area maintains normal operation of the FPGA under test.

In operation, the controller 12 accesses the FPGA under test 10 in a known manner such that access is transparent to normal function of the FPGA 10. As best shown in FIG. 2, the FPGA under test 10 is initially configured by the controller 12 into an initial self-testing area 16 and a working area 18. Advantageously, this approach allows for normal operation of the FPGA under test 10 to be maintained within the working area 18 while the FPGA resources are each tested for faults in the initial self-testing area 16.

More specifically, the initial self-testing area 16 is preferably configured to include a vertical self-testing area 20 and a horizontal self-testing area 22 (shown in FIG. 3) which intermittently rove around the FPGA under test 10 during testing. While only one self-testing area is required to test PLBs, both self-testing areas 20 and 22 are required for identifying faulty PLBs or programmable routing resources, and for testing the programmable routing resources.

Figure 3:
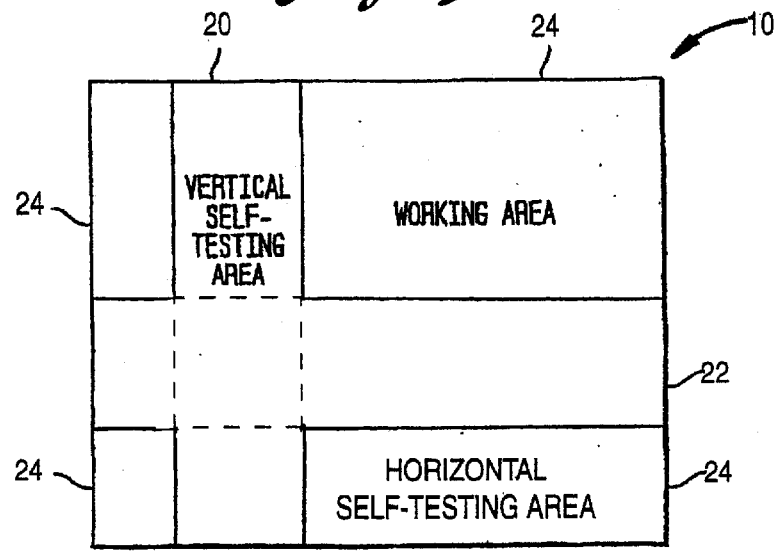
FIG. 3 is an illustration of the FPGA under test configured such that the working area is divided into four disjoint areas by a vertical self-testing area and a horizontal self-testing area.

Depending upon the location of the two self-testing areas 20 and 22 at any given time during testing, the working area 18 may be contiguous, or it may be divided into two or four disjoint regions 24 as shown in FIG. 3. To accommodate testing in the self-testing areas 20 and 22, vertical wire segments in the vertical self-testing area 20 and horizontal wire segments in the horizontal self-testing area 22 are all designated reserved or unusable during operation of the FPGA under test 10. In this manner, connections between PLBs in the disjoint regions 24 of the working area 18 may be made utilizing the horizontal wire segments through the vertical self-testing area 20 and vertical wire segments through the horizontal self-testing area 22.

Figure 4:
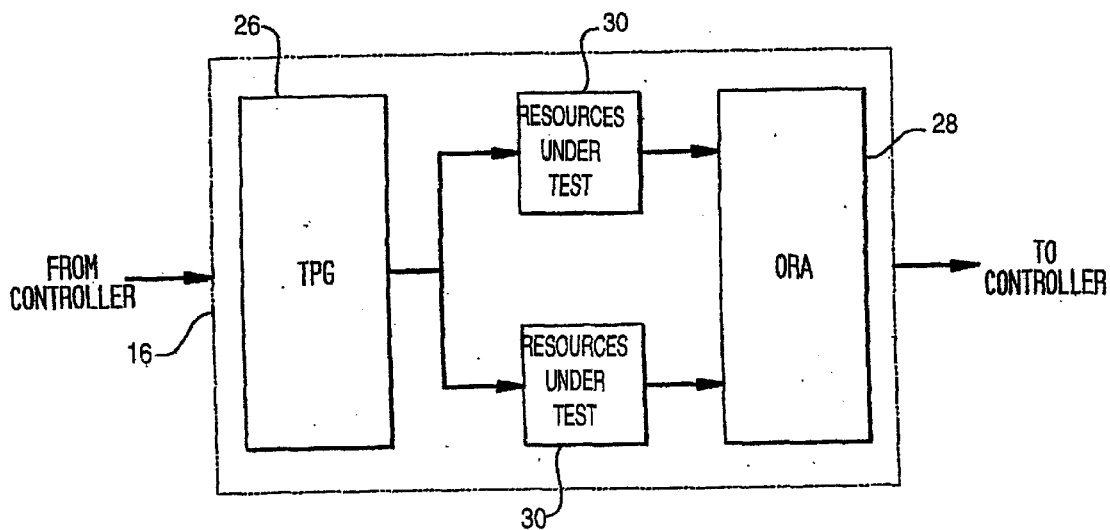
FIG. 4 is a schematic block diagram showing a preferred comparison-based self-testing area configured to include a test pattern generator, an output response analyzer, and two groups of FPGA resources under test.

Testing of the FPGA 10 is generally accomplished by configuring its resources within the initial self-testing area 16 to function as a test pattern generator (TPG) 26 and an output response analyzer (ORA) 28, and as equivalently configured FPGA resources under test 30 as shown in FIG. 4. During testing, equivalent test patterns generated using the TPG 26 are applied to the FPGA resources under test 30. Outputs of the FPGA resources under test 30 are compared by the ORA 28 to determine whether a fault exists within either of the resources under test 30. A match/mismatch result of the comparison performed by the ORA 28 is communicated as a pass/fail result or fault status data through boundary-scan ports of the FPGA 10 (not shown) to the controller 12. The fault status data is stored in memory 14 and utilized by the controller 12 in reconfiguring the FPGA resources for further testing and fault tolerant operation as described in more detail below.

Figure 5:
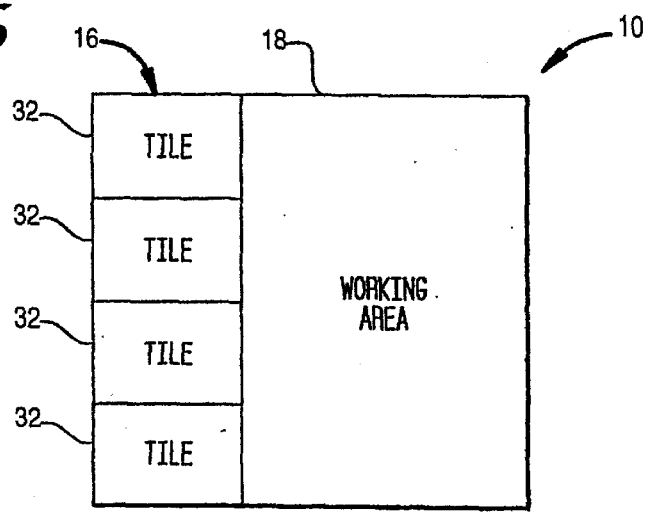
FIG. 5 is an illustration of the preferred FPGA under test with the initial self-testing area divided into several distinct self-testing tiles.
Figure 6A:
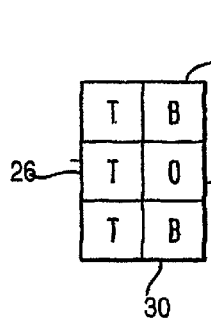
Figure 6B:
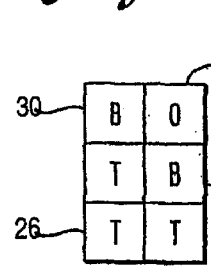
Figure 6C:
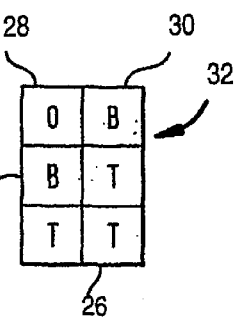

When testing the PLBs as shown in FIG. 5, the initial self-testing area 16 is preferably divided into any number of equivalently configured self-testing tiles 32 so long as each testing tile 32 contains a sufficient amount of FPGA resources to complete testing. In other words, each testing tile 32 must include at least a group of PLBs configured to function as the TPG 26, a group of PLBs configured to function as the ORA 28, and PLBs under test 30. As shown in FIGS. 6A–6C, for example, a typical TPG 26 may include a group of three PLBs (T), and single PLBs (O and B) may be configured to function as the ORA 28 and the PLBs under test 30. By systematically rotating the functions of the PLBs in each self-testing tile 32, as sequentially shown in FIGS. 6A–6F, each PLB becomes a PLB under test 30 exactly twice during the preferred method of testing, each time being compared to a different PLB under test. This type of repeating strategy allows for the detection of both single faulty PLBs, as well as, several concurrently faulty PLBs. In addition, the utilization of several self-testing tiles 32 allows for concurrent testing of PLBs within the tiles 32, thus reducing the overall test time and fault latency.

Complete testing of the PLBs within the self-testing tiles 32 is achieved by repeatedly reconfiguring the PLBs under test 30 for testing in every possible mode of operation and applying exhaustive test patterns in each mode of operation. Without having a detailed knowledge of the implementation of the FPGA under test 10, the modes of operation of its PLBs may be determined only from the information provided in an associated FPGA data manual. In addition to repeatedly reconfiguring the PLBs under test 30, the TPG 26 is reconfigured by the controller 12 for each new mode of operation of the PLBs under test 30 which require test patterns different from the ones generated for the previous mode of operation. The ORA 28 is also reconfigured by the controller 12 when the new mode of operation of the PLBs under test 30 involves a different number of outputs. It is important to note that all of these reconfigurations occur concurrently with the normal operation of the FPGA under test 10, which is unaffected by and unaware of the testing activity. The present preferred comparison-based on-line method of testing is described in greater detail for programmable logic blocks in pending U.S. application Ser. No. 09/405,958 incorporated herein by reference.

When the fault status data indicates the detection of a fault in one of the PLBs 30 of a testing tile 32, roving of the self-testing areas is initially interrupted in order to identify the faulty PLB and to identify its faulty modes of operation. Specifically, the initial self-testing area 20 or 22 wherein the faulty PLB lies is reconfigured for further testing in order to identify the faulty PLB. Preferably, the FPGA resources contained within an initial self-testing tile are subdivided for inclusion with known fault-free PLBs in two subsequent testing tiles. The PLBs in each subsequent testing tile are independently tested in the manner described above. Dependent upon the subsequent test results, the FPGA resources within one or both of the subsequent testing tiles may be further reconfigured or subdivided and tested until the detected faulty PLB is identified.

The following example is presented to further illustrate the present invention:

EXAMPLE

As sequentially shown in FIGS. 7A–7D, upon detection of a fault in one of the PLBs (A–F) in an initial self-testing tile 32 configured within an initial vertical self-testing area 33, the FPGA resources within the initial self-testing tile 32 are subdivided for inclusion in two subsequent testing tiles 34 and 36 within the vertical self-testing area 33. As shown in FIG. 7B, PLBs A and B are grouped with additional known fault-free FPGA resources (FF) to form an upper vertical self-testing tile 34, and PLBs C, D, E, and F are grouped with additional known fault-free FPGA resources (FF) to form a lower vertical self-testing tile 36.

For purposes of illustration, assume that the PLBs A and B within the upper vertical testing tile 34 pass all subsequent exhaustive testing but a fault is detected in the PLBs within the lower vertical testing tile 36. The lower vertical testing tile 36 is again subdivided into additional distinct vertical testing tiles 38, 40. As shown in FIG. 7C, PLBs C and D are grouped with additional known fault-free FPGA resources (FF) to form a second upper vertical testing tile 38, and PLBs E and F are grouped with additional known fault-free FPGA resources (FF) to form a second lower vertical testing tile 40. Again, assume that the PLBs within the upper vertical testing 38 pass all subsequent exhaustive testing and the fault is detected in the lower vertical testing tile 40.

As shown in FIG. 7D, the remaining PLBs C and D which potentially contain the detected fault reside in the same row thus precluding further subdividing into distinct vertical self-testing tiles. However, by reconfiguring the self-testing tile 40 into distinct left side and right side horizontal self-testing tiles 42 and 44 utilizing a horizontal self-testing area 45, the remaining PLBs C and D may be tested by grouping them with additional known fault-free FPGA resources (FF) for further testing. At this point, the detected fault is completely identified to PLB C or D dependent upon the results of testing. The test and reconfiguration controller 12 will use this data to reconfigure the remaining FPGA resources to avoid the identified faulty PLB altogether. Alternatively, diagnostic testing of the identified PLB is conducted in order to determine a faulty mode of operation of the PLBs.

In other words, once identified, the faulty PLB is completely tested in every possible mode of operation. To accomplish such a complete test, the faulty PLB is repeatedly reconfigured and test patterns sufficient to detect all possible faults in the memory, flip-flop or combinational output logic blocks of the PLB are applied. More specifically, exhaustive testing is utilized to test each block of the PLB with sets of exhaustive test patterns. Based on the fault status data generated during the further exhaustive testing of the identified logic block, partially faulty logic blocks may be reconfigured to perform non-faulty functions or modes of operation and further utilized. By reconfiguring partially faulty logic blocks to avoid all modes of operation affected by the detected fault, the partially faulty logic blocks are allowed to continue to operate in a progressively diminished, although acceptable, capacity for specific operating modes. This type of exhaustive testing and fault tolerant operation is described in detail in the above noted pending U.S. application Ser. No. 09/261,776 incorporated herein by reference.

Figure 8:
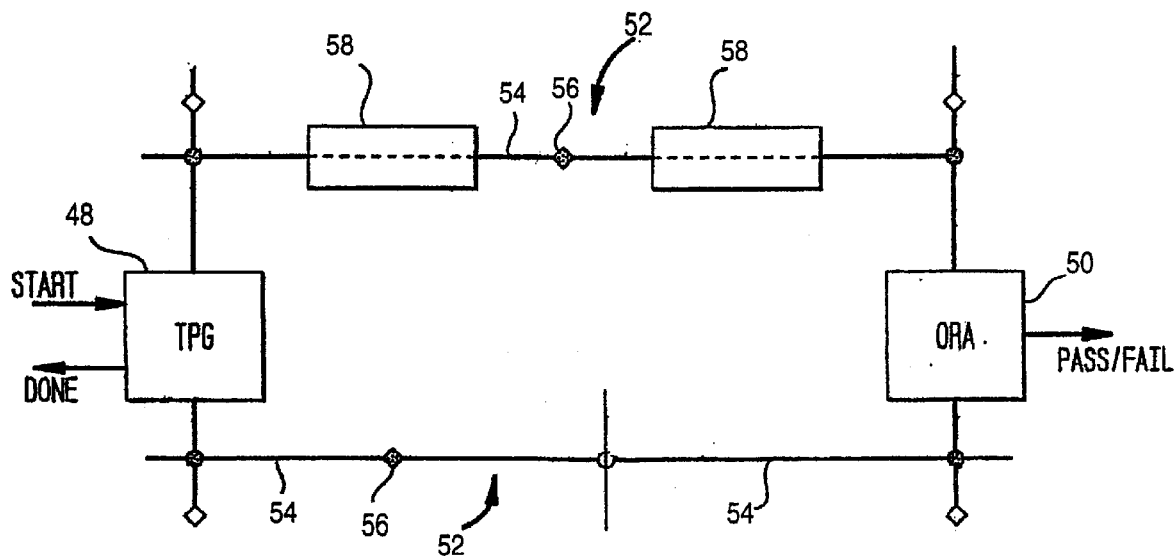
FIG. 8 is a schematic block diagram showing a preferred comparison-based self-testing area configured to include a test pattern generator, an output response analyzer, and two groups of wires under test.

In a manner similar to that described with respect to the testing of programmable logic blocks, the programmable routing resources including both global routing resources for carrying signals amongst the array of PLBs and local routing resources for carrying signals into and out of the PLBs are comparatively tested. Specifically, as shown in FIG. 8, PLBs within the initial self-testing area 16 are configured to function as a TPG 48 and an ORA 50, and a portion of the programmable routing resources are configured to include at least two groups of wires under test (WUTs 52). The groups of WUTs 52 may include wire segments 54, configurable or configuration interconnect points (CIPs 56), and PLBs 58.

Figure 9:
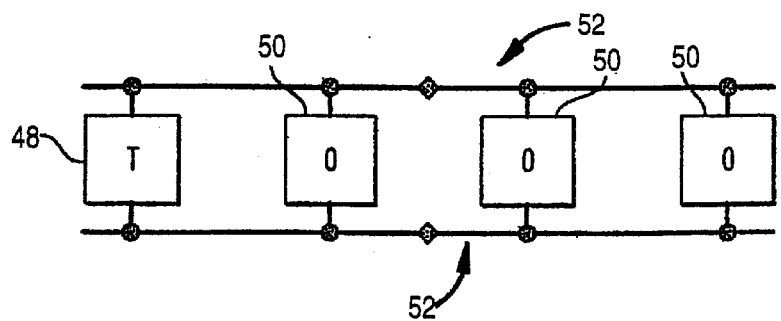
FIG. 9 is a schematic block diagram showing a preferred comparison-based self-testing area configures to include a test pattern generator, two groups of wires under test, and several output response analyzers to accommodate parallel testing.

During testing exhaustive test patterns generated using the TPG 48 are applied to and propagated along the groups of WUTs 52. The outputs of the groups of WUTs 52 are compared by the ORA 50 to determine whether a fault exists within either group of WUTs 52. A match/mismatch result of the comparison performed by the ORA 50 is communicated as a pass/fail test result or fault status data through the boundary-scan ports of the FPGA under test 10 to the controller 12. The fault status data is stored in memory 14 and utilized by the controller 12 in reconfiguring the FPGA resources for the testing and fault tolerant reconfiguration as described in more detail below. In order to minimize the number of reconfigurations required during testing, and therefore the total testing time, parallel testing of the programmable routing resources is preferably utilized. Specifically, as shown in FIG. 9, comparisons of the output patterns of segments 54 of the groups of WUTs 52 may be made at several locations along the groups of WUTs 52 utilizing more than one ORA 50. Advantageously, this allows one set of TPG generated test patterns to be used to test several differing groups of WUTs per configuration. The present preferred comparison-based on-line method of testing is described in greatest detail for programmable routing resources in pending U.S. application Ser. No. 09/406,219 incorporated herein by reference.

When the fault status data indicates the detection of a fault in one of the groups of WUTs 52 in a self-testing area, roving of the self-testing areas is initially interrupted in order to identify the faulty programmable routing resource. Specifically, the groups of WUTs 52 wherein the faulty programmable routing resource was detected are reconfigured for further testing in order to identify the faulty programmable routing resource. Preferably, the FPGA resources contained within the group of WUTs 52 containing the faulty resource are subdivided for inclusion in two subsequent groups of WUTs having known fault-free resources. The programmable routing resources in each subsequent group of WUTs are independently tested in the manner described above. Dependent upon the subsequent test results, the programmable routing resources within one or both of the subsequent groups of WUTs may be further reconfigured or subdivided and tested until the detected faulty programmable routing resource is identified.

Upon completion of testing of each of the FPGA resources within the initial self-testing area 16, the FPGA under test 10 is reconfigured such that the functions of the PLBs forming a portion of the working area are copied to the PLBs forming the initial self-testing area 16 and appropriately re-routed. Once completed, the copied portion of the working area becomes a subsequent self-testing area. Preferably, the initial self-testing area 16 is reconfigured as an adjacent portion of the working area, i.e., the programmed function of an adjacent portion of the working area is relocated or more specifically, copied to the initial self-testing area 16, and the adjacent portion of the working area is reconfigured as the subsequent self-testing area. The present preferred method of roving the self-testing area 16 and reconfiguring the FPGA under test 10 is described in detail in the above noted U.S. application Ser. No. 09/405,958 incorporated herein by reference.

In accordance with the present inventive method, the FPGA resources of the subsequent self-testing area are similarly tested, detected faults within the resources identified, and their faulty modes of operation diagnosed as described above for the initial self-testing area 16. This continues until each portion of the entire FPGA under test 10, is reconfigured as a subsequent self-testing area and its resources tested and reconfigured if required. In other words, the self-testing area continuously roves around the FPGA under test 10 repeating the steps of configuring, testing, identifying, and reconfiguring so long as the FPGA 10 is in operation. Advantageously, normal operation of the FPGA 10 continues uninterrupted by the testing conducted within the self-testing areas.

In summary, the method of testing field programmable gate arrays in fault tolerant applications is carried out during normal on-line operation of the FPGA by configuring the FPGA resources into a working area and an initial self-testing area. The working area maintains normal operation of the FPGA throughout testing. Within the initial and subsequent self-testing areas, however, the FPGA resources are each tested and faulty resources identified by reconfiguring or subdividing and further testing the FPGA resources until the faulty resource is identified. Advantageously, the working area is substantially unaffected by testing, and testing time constraints are reduced since normal operation continues in the working area.

The foregoing description of a preferred embodiment of the present invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of testing resources of a field programmable gate array during normal on-line operation comprising the steps of:

configuring said field programmable gate array into an initial self-testing area and a working area, said working area maintaining normal operation of the field programmable gate array;

testing resources located within said initial self-testing area for faults;

reconfiguring said resources located within said initial self-testing area for further testing in order to identify at least one resource having a fault detected during said initial testing step;

further testing said resources located within said reconfigured initial self-testing area for faults; and repeating the steps of reconfiguring and testing until said at least one faulty resource is identified, whereby the field programmable gate array may be reconfigured to replace said at least one identified faulty resource in order to provide fault tolerant operation of the field programmable gate array.

2. The method set forth in claim 1, wherein the configuring step includes configuring said initial self-testing area to include at least one initial testing tile of programmable logic blocks.

3. The method set forth in claim 2, wherein the configuring step further includes establishing said programmable logic blocks in said at least one initial testing tile to function as a test pattern generator and an output response analyzer, and equivalently configured programmable logic blocks under test.

4. The method set forth in claim 3, wherein said initial testing step includes applying test patterns generated by said test pattern generator to said programmable logic blocks under test in said at least one initial testing tile;
   comparing outputs of said programmable logic blocks under test using said output response analyzer in said at least one initial testing tile; and
   producing fault status data for said programmable logic blocks under test.

5. The method set forth in claim 4, further comprising the step of systematically rotating the functions of said programmable logic blocks within said at least one initial testing tile so that each of said programmable logic blocks within said at least one initial testing tile becomes one of said programmable logic blocks under test during said initial testing step and is compared to at least two different said programmable logic blocks within said at least one initial testing tile.

6. The method set forth in claim 2, wherein said reconfiguring step includes configuring said initial self-testing area to include at least two subsequent testing tiles of programmable logic blocks, each of said subsequent testing tiles including a subdivided portion of said programmable logic blocks located within said at least one initial testing tile.

7. The method set forth in claim 6, wherein the step of separately testing said resources within said reconfigured initial self-testing area includes establishing said programmable logic blocks in each of said subsequent testing tiles to function as a test pattern generator and an output response analyzer, and equivalently configured programmable logic blocks under test, and
   testing said programmable logic blocks in said subsequent testing tiles for faults.

8. The method set forth in claim 7, wherein the step of testing said programmable logic blocks in said subsequent testing tiles further includes:
   applying test patterns generated by said test pattern generator to said programmable logic blocks under test in said subsequent testing tiles;
   comparing outputs of said programmable logic blocks under test using said output response analyzer in said subsequent testing tiles; and
   producing fault status data for said programmable logic blocks under test in said subsequent testing tiles.

9. The method set forth in claim 7, further comprising the step of systematically rotating the functions of said programmable logic blocks within said subsequent testing tiles so each programmable logic block within said subsequent testing tiles becomes one of said programmable logic blocks under test during said further testing step and is compared to at least two different programmable logic blocks within said subsequent testing tiles.

10. The method set forth in claim 1, wherein said at least one identified resource is a programmable logic block; and
    diagnosing a faulty mode of operation of said at least one identified programmable logic block.

11. The method set forth in claim 10, wherein the step of diagnosing a faulty mode of operation of said at least one identified programmable logic block includes establishing at least a portion of said initial self-testing area resources to function as a test pattern generator and an output response analyzer, and equivalently configured programmable logic blocks under test such that said identified programmable logic block is one of said equivalently configured programmable logic blocks under test.

12. The method set forth in claim 11, further comprising the steps of applying test patterns generated by said test pattern generator to said programmable logic blocks under test;
    comparing outputs of said programmable logic blocks under test using said output response analyzer; and
    producing fault status data indicating of a faulty mode of operation of said identified programmable logic blocks under test.

13. The method set forth in claim 12, wherein said test patterns are sufficient in number to test each mode of operation of said identified programmable logic block.

14. The method set forth in claim 10, further comprising the step of reconfiguring the field programmable gate array to replace said at least one identified programmable logic block in order to provide fault tolerant operation only if said detected faulty mode of operation prevents a programmed operation of said at least one identified programmable logic block,
    whereby partially faulty programmable logic blocks may be further utilized to provide fault tolerant operation of the field programmable gate array.

15. The method set forth in claim 1, wherein the step of configuring said field programmable gate array into an initial self-testing area and a working area further includes establishing at least two testing tiles of programmable logic blocks within said initial self-testing area; and
    wherein said initial testing step is performed on said programmable logic blocks within said at least two testing tiles concurrently.

16. The method set forth in claim 1 further comprising the step of reconfiguring said field programmable gate array such that a portion of said working area becomes a subsequent self-testing area and at least a portion of said initial self-testing area becomes a portion of said working area.

17. The method set forth in claim 1, wherein the configuring step further includes establishing programmable logic blocks within said initial self-testing area to function as a test pattern generator and an output response analyzer, and a portion of programmable routing resources within said initial self-testing area as at least two groups of wires under test.

18. The method set forth in claim 17, wherein said initial testing step further includes propagating test patterns generated by said test pattern generator along said at least two groups of wires under test;
    comparing outputs of said groups of wires under test using said output response analyzer; and
    producing fault status data for said at least two groups of wires under test.

19. The method set forth in claim 18, further comprising the step of repeatedly reconfiguring said programmable routing resources so each of said programmable routing resources within said initial self-testing area is configured as said groups of wires under test at least once during said initial testing step.

20. The method set forth in claim 1, wherein said reconfiguring step includes establishing said resources located within said initial self-testing area as at least two subsequent groups of wires under test, one of said subsequent groups including a subdivided portion of said programmable routing resources located within one of said initial groups of wires under test.

21. The method set forth in claim 20, wherein the step of further testing said resources within said reconfigured initial self-test area includes testing said programmable routing resources located within said subsequent groups of wires under test for faults.

22. The method set forth in claim 1, wherein the configuring step further includes establishing programmable logic blocks within said initial self-testing area to function as a test pattern generator and at least two output response analyzers, and a portion of programmable routing resources within said initial self-testing area as at least two groups of wires under test; and wherein said initial testing step further includes propagating test patterns generated by said test pattern generator along said at least two groups of wires under test, comparing outputs of segments of said groups of wires under test using said at least two output response analyzers, and producing fault status data for said segments of said subsequent groups of wires under test.

23. An apparatus for testing the resources of at least one field programmable gate array during normal on-line operation comprising:

a controller in communication with the at least one field programmable gate array for (a) configuring the at least one field programmable gate array into an initial self-testing area and a working area, said working area maintaining normal operation of the field programmable gate array, (b) testing the resources located within said initial self-testing area for faults, (c) reconfiguring the resources located within said initial self-testing area for further testing in order to identify at least one resource having a fault detected during initial testing, (d) further testing resources located within said reconfigured self-testing area, and (e) repeating the steps of (c) and (d) until said at least one faulty resource is identified.

24. The apparatus for testing the resources of at least one field programmable gate array during normal on-line operation of claim 23, further comprising at least one storage medium in communication with said controller for storing a plurality of test configurations, and usage and fault status data for each resource.

25. A field programmable gate array comprising:

a plurality of programmable logic blocks;

a plurality of programmable routing resources interconnecting said programmable logic blocks;

said programmable logic blocks and said programmable routing resources being initially configured as at least one initial self-testing area for testing at least a portion of said programmable logic blocks for faults, and an initial working area for maintaining normal operation of the field programmable gate array during testing;

said portion of said programmable logic blocks located within said initial self-testing area being subdivided for further testing until said faulty programmable logic block is identified.

26. The field programmable gate array of claim 25, wherein said portion of programmable logic blocks of said initial self-testing area is configured as at least one initial testing tile of programmable logic blocks; and wherein said at least one initial testing tile is subdivided and its programmable logic blocks utilized in at least two subsequent testing tiles for further testing; and wherein said subsequent testing tiles are further subdivided and their programmable logic blocks utilized in subsequent testing tiles for further testing tested until said faulty programmable logic block is identified.

* * * * *